(12) United States Patent  
Masleid et al.

(10) Patent No.: US 9,136,850 B2
(45) Date of Patent: Sep. 15, 2015

(54) PHASE ALIGNER WITH SHORT LOCK TIME (71) Applicant: Oracle International Corporation, Redwood City, CA (US)

(72) Inventors: Robert P. Masleid, Monte Sereno, CA (US); Anand Dixit, Mountain View, CA (US)

(73) Assignee: Oracle International Corporation, Redwood Shores, CA (US)

( * ) Notice: Subject to any disclaimer, the term of this patent is extended or adjusted under 35 U.S.C. 154(b) by 72 days.

(21) Appl. No.: 14/146,883

(22) Filed: Jan. 3, 2014

(65) Prior Publication Data
US 2015/0194968 A1 Jul. 9, 2015

(51) Int. Cl.
*H03L 7/00* (2006.01)
*H03K 5/14* (2014.01)
(52) U.S. Cl.
CPC ... *H03L 7/00* (2013.01); *H03K 5/14* (2013.01)
(58) Field of Classification Search
USPC .......................................... 327/161, 261, 269
See application file for complete search history.

(56) References Cited

U.S. PATENT DOCUMENTS

| | | | | |
|---|---|---|---|---|
| 6,127,874 A | * | 10/2000 | Wakabayashi et al. | 327/292 |
| 6,426,662 B1 | * | 7/2002 | Arcus | 327/295 |
| 6,429,693 B1 | * | 8/2002 | Staszewski et al. | 327/12 |
| 8,198,931 B2 | | 6/2012 | Le et al. | |
| 8,242,823 B2 | * | 8/2012 | Le et al. | 327/161 |
| 8,283,960 B2 | | 10/2012 | Le et al. | |
| 2010/0271099 A1 | * | 10/2010 | Le et al. | 327/261 |
| 2010/0271100 A1 | * | 10/2010 | Le et al. | 327/269 |
| 2011/0133973 A1 | * | 6/2011 | Yamamoto et al. | 341/166 |
| 2014/0035650 A1 | * | 2/2014 | Zerbe et al. | 327/299 |

* cited by examiner

*Primary Examiner* — Adam Houston
(74) *Attorney, Agent, or Firm* — Meyertons Hood Kivlin Kowert & Goetzel; Erik A. Heter

(57) ABSTRACT

A phase alignment circuit is disclosed. In one embodiment, the circuit includes a register configured to capture and store, in parallel from a delay unit, a plurality of samples of a first signal, responsive to a change of state of a second signal. The circuit further includes a detection circuit configured to detect a bit position in the register at which a state change of the first signal occurs based on a concurrent evaluation of all samples of the first signal. Selection circuitry in the phase alignment circuit is configured to select an output from a one of a plurality of delay elements of the delay unit based on in the bit position at which the state change was detected. The selection circuitry is configured to output a third signal that is a delayed version of the first signal.

20 Claims, 10 Drawing Sheets

PHASE ALIGNER WITH SHORT LOCK TIME

BACKGROUND

1. Technical Field

This disclosure relates to electronic circuits, and more particularly, to circuits for aligning clock and data signals.

2. Description of the Related Art

Integrated circuits (ICs) and electronic systems in general may include multiple functional units in which data signals are exchanged. The data signals may be synchronized by a clock signal that may be sent with the data or generated locally by the receiving functional unit. In some cases, skew may occur between the data signals and clock signals. Such skew may be corrected in some cases by alignment circuits.

Two types of circuits commonly used for performing phase alignment between data signals and clock signals are phase locked loops (PLLs) and delay locked loops (DLLs). Both types of these circuits may implement an analog phase detector and closed loop feedback. A PLL may include a voltage-controlled oscillator (VCO), while a DLL may include a voltage-controlled delay line (VCDL). These types of phase alignment circuits may incrementally adjust the phase difference between a clock signal and a data signal (or more generally, any two signals for which phase alignment is desirable) over time. Typically, such circuits may sample a phase difference at a single point in time and make an incremental adjustment to the phase difference. The feedback loop may be used to provide each sample, after which incremental adjustments may continually be made until the signals are in the desired phase alignment.

SUMMARY OF THE DISCLOSURE

A phase alignment circuit is disclosed. In one embodiment, the circuit includes a register configured to capture and store, in parallel from a delay unit, a plurality of samples of a first signal, responsive to a change of state of a second signal. The circuit further includes a detection circuit configured to detect a bit position in the register at which a state change of the first signal occurs based on a concurrent evaluation of all samples of the first signal. Selection circuitry in the phase alignment circuit is configured to select an output from a one of a plurality of delay elements of the delay unit based on the bit position at which the state change was detected. The selection circuitry is configured to output a third signal that is a delayed version of the first signal.

In one embodiment, a method comprises capturing and storing, in parallel, a plurality of samples of a first signal responsive to a change of state of a second signal, wherein said capturing comprises a register capturing the plurality of samples from a delay unit having a plurality of serially-coupled delay elements. The method further includes detecting a bit position in the register at which a state change of the first signal is detected based on a concurrent evaluation of all the samples of the first signal. An output of one of the delay elements selected based on the bit position at which the state of change of the first signal was detected. The method also includes selecting, based on the bit position at which the state of change of the first signal was detected, an output of one of the delay elements to be coupled via selection circuitry to provide a third signal, wherein the third signal is a delayed version of the first signal.

BRIEF DESCRIPTION OF THE DRAWINGS

Other aspects of the disclosure will become apparent upon reading the following detailed description and upon reference to the accompanying drawings which are now described as follows.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Figure 1A:
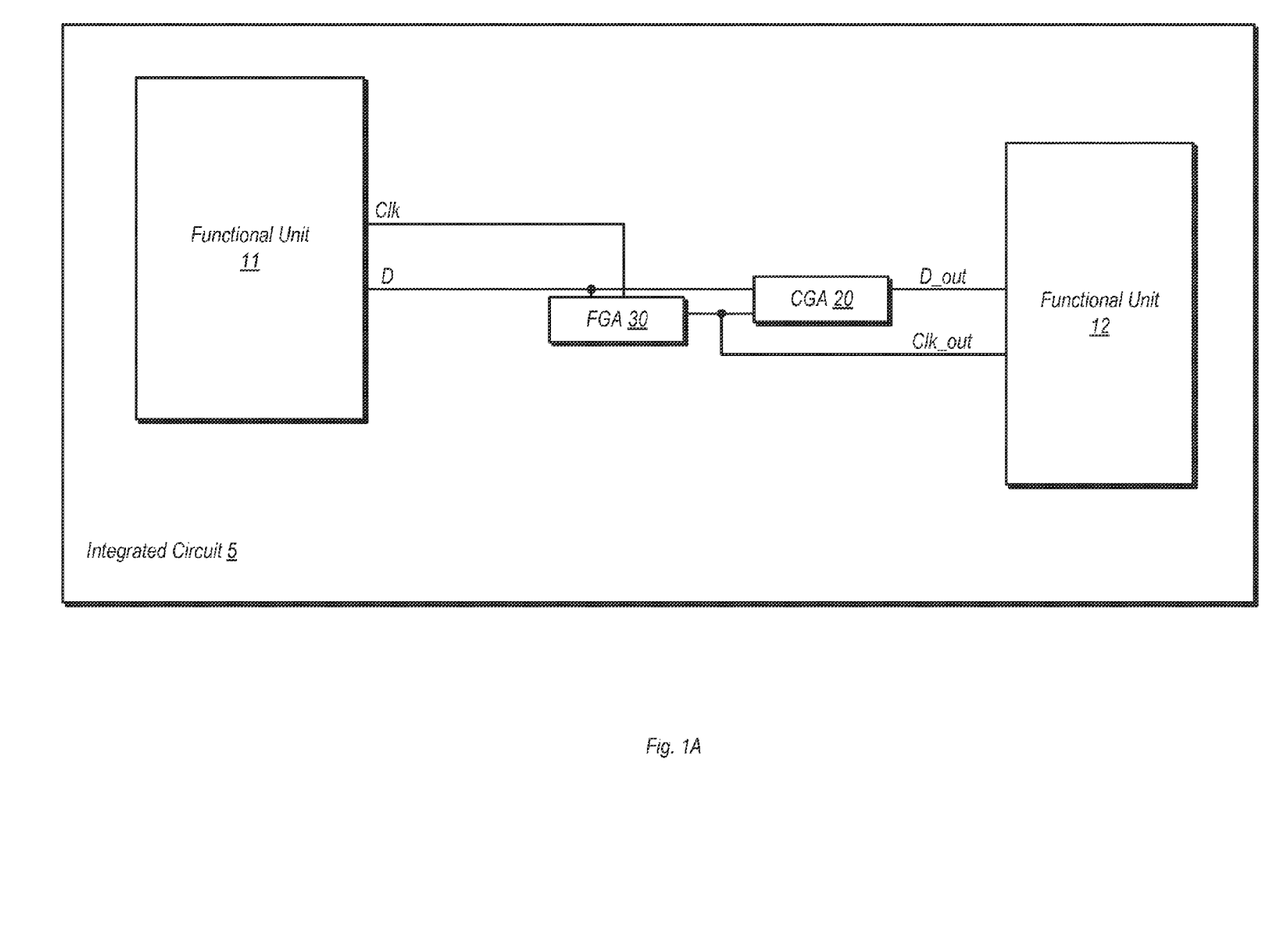
FIG. 1A is a block diagram of one embodiment of an integrated circuit (IC).

FIG. 1A is a simplified block diagram of one embodiment of an integrated circuit (IC). In the embodiment shown, IC 5 includes a first functional unit 11 and a second functional unit 12. During operation of IC 5, signals may be transmitted between the functional units. Exemplary signal paths for a data signal 'Data' and a clock signal 'Clk' are shown in this drawing. The data and clock signal paths include a fine grain alignment circuit (CGA) 20 and a coarse grain alignment circuit (FGA) 30. These alignment circuits are configured to align the data and clock signals into a desired phase relationship.

CGA 20 may align the data signal to within a specified amount of a period of the clock signal in the embodiment shown. For example, one embodiment of CGA 20 may align the data signal to within one half cycle of the clock signal. FGA 30 may align the edges of the data signal and the clock signal to within a specified range such that any skew therebetween is negligible, even at high operational speeds.

In FIG. 1A, FGA 30 receives the clock signal and the data signal as inputs from functional unit 11, and outputs a delayed version of the clock signal, Clk_out. CGA 30 then receives the delayed version of the clock signal and the data signal as inputs, and outputs a delayed version of the data signal, D_out. The delayed versions of the clock and data signals provided to functional unit 12 are substantially aligned, with any phase difference therebetween being negligible.

Figure 1B:
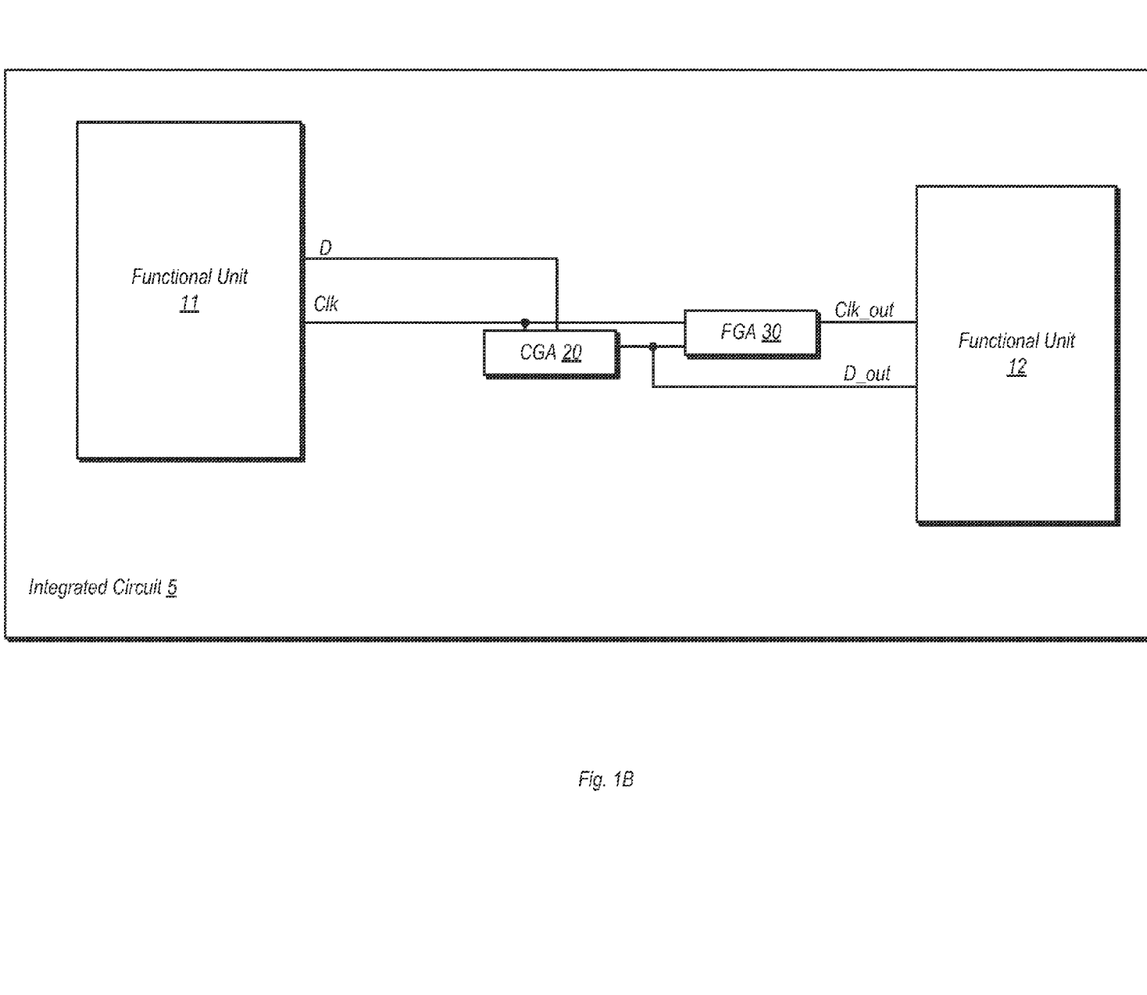
FIG. 1B is a block diagram of another embodiment of an IC.

FIG. 1B shows an alternate embodiment of IC 5. In this case, the order of CGA 20 and FGA 30 is reversed. CGA 20 receives as inputs the clock and data signals from functional unit 11, and outputs a delayed data signal, D_out. FGA 30 receives the clock signal and the delayed data signal as inputs, and outputs a delayed clock signals. As with the embodiment shown in FIG. 1A, the delayed clock and delayed data signals are substantially aligned as provided to functional unit 12.

In the embodiments shown in FIGS. 1A and 1B, CGA 20 and FGA 30 may be implemented entirely with digital circuitry. That is, CGA 20 and FGA 30 may both be implemented without the use of a phase detector, or other analog circuits (e.g., a voltage controlled oscillator, voltage controlled delay line, analog low pass filters, differential amplifiers etc.). As analog circuitry can consume a significant amount of area on an IC die, the ability to implement CGA 20 and FGA 30 using only circuitry configured for digital operation may significantly reduce the amount of area required for each instance of these circuits. The all-digital implementation of CGA 20 and FGA 30 may thus simplify porting these circuits from one IC technology to the next (e.g., from 28 nm to 22 nm). Moreover, both of CGA 20 and FGA 30 may be implemented without a feedback loop, while also having the capability to acquire a number of samples simultaneously. Thus, instead of performing incremental adjustments in the phase relationship based on singular samples and feedback, CGA 20 and FGA 30 may each evaluate a number of samples in parallel and choose a sample of interest. Stated another way, each of CGA 20 and FGA 30 may perform a simultaneously/concurrently evaluate a number of samples in a single pass and align the signals based thereon. Details of how CGA 20 and FGA 30 perform these operations are presented in the discussion of the remaining figures.

As used herein, the term "digital" when applied to the circuitry of CGA 20 and FGA 30 indicates that the operation of such circuitry may be described by digital logic operations including sequential logic operations and combinational logic operations. CGA 20 and FGA 30 furthermore are considered fully digital for process model, composition, defect, and test purposes. No analog operations of interest are performed by these circuits.

It is noted that both FIGS. 1A and 1B are simplified block diagrams presented here for illustrative purposes, but are not intended to limit the scope of any IC or embodiments thereof including the alignment circuits discussed herein. It is further noted that while the discussion herein has focused on aligning a clock signal with a data signal, the circuits disclosed herein may be used to align other types of signals for which a particular alignment is desired.

Figure 2A:
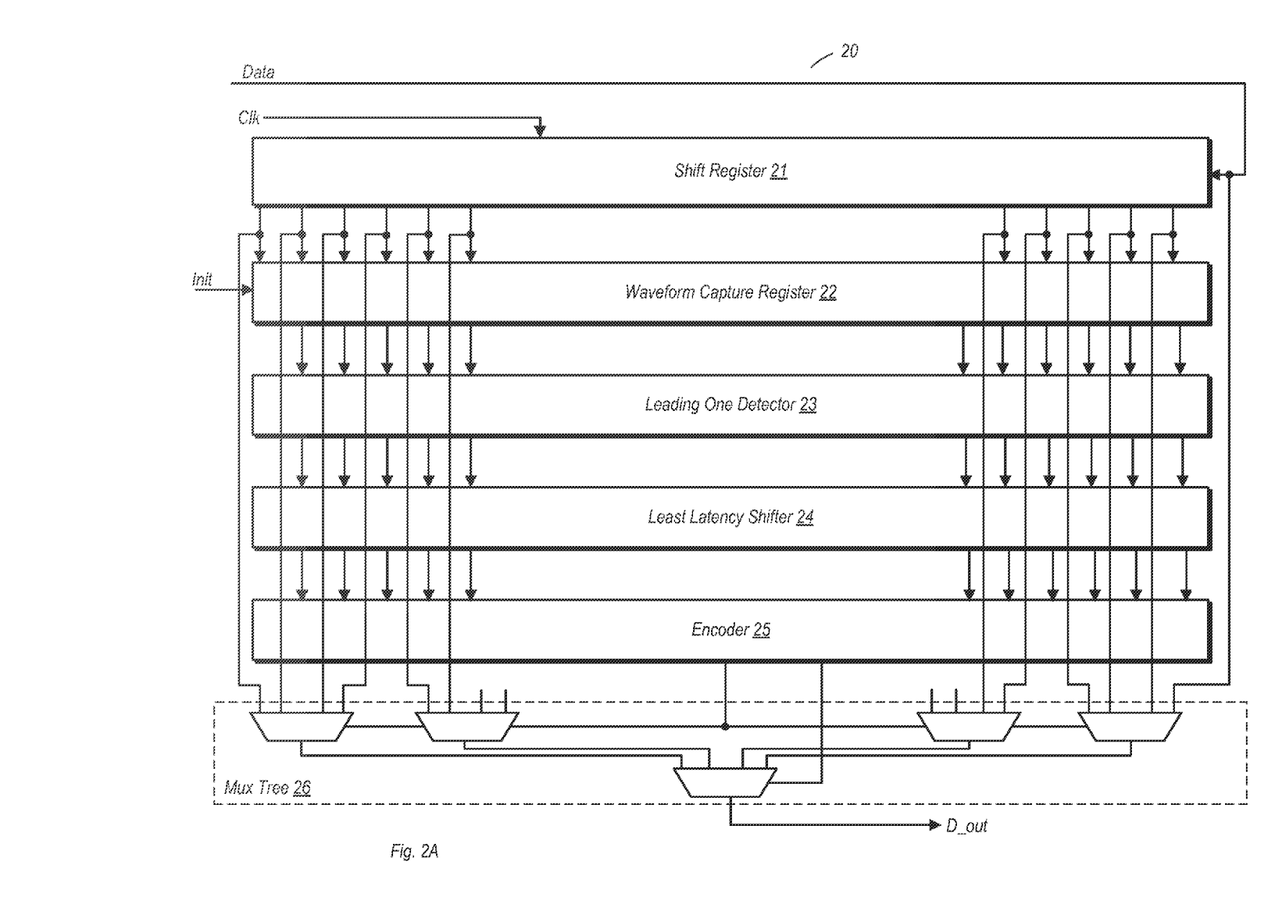
FIG. 2A is a diagram illustrating one embodiment of a coarse alignment circuit.

FIG. 2 is a block diagram of one embodiment of a CGA 20. In the embodiment shown, CGA 20 includes a shift register 21, a waveform capture register 22, a leading one detector 23, an encoder 25, and a multiplexer tree 26. CGA 20 in this embodiment also includes a least latency shifter 24, which is optional, and may be included in instances wherein, e.g., a number of data signals are to be aligned to a single clock signal. In instances wherein a single data signal is to be aligned with a single clock signal, the least latency shifter 24 may be dispensed with or included as desired.

Figure 2B:
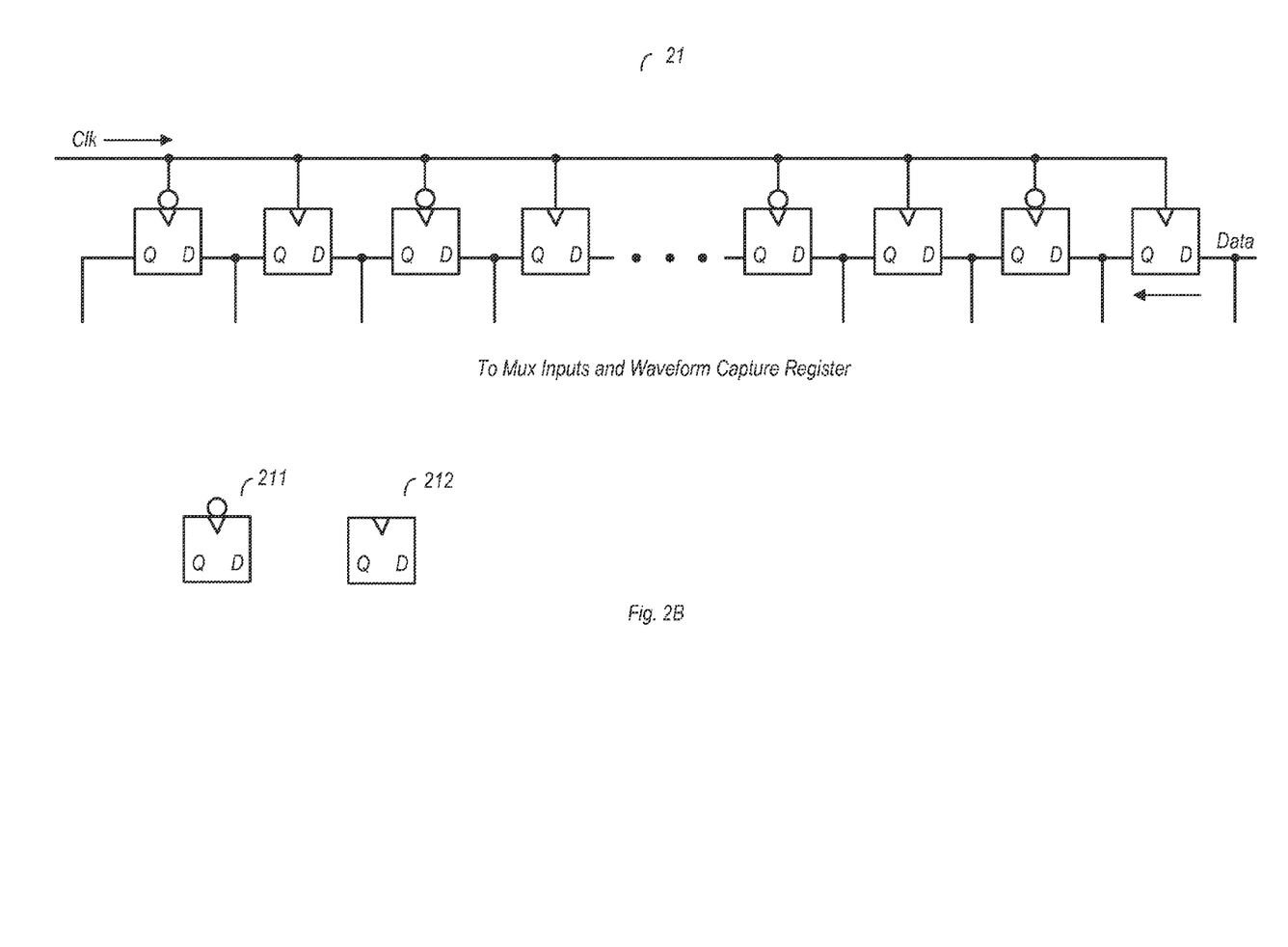
FIG. 2B is a diagram illustrating additional details of one embodiment of a coarse alignment circuit.

Shift register 21 in the embodiment shown is coupled to receive the clock signal and the data signal. An exemplary embodiment of shift register 21 is shown in FIG. 2B. In the exemplary embodiment, shift register 21 includes a number of serially-coupled storage elements. The clock signal is provided to a clock input of each storage element. The data signal is input into a first storage element, and propagates to subsequent storage elements in the serially-coupled chain of storage elements responsive to changes of the clock signal. The serially-coupled chain of storage elements is comprised of alternating instances of storage element 211 and 212. Storage element 211 in the embodiment shown is negative-edge triggered, and thus becomes transparent responsive to the falling edge of the clock signal. Storage element 212 in the embodiment shown is positive-edge triggered, and thus becomes transparent responsive to the rising edge of the clock signal. Thus, by alternating storage elements 211 and 212 in a serially-coupled configuration as shown, the data signal advances by one storage element each half cycle of the clock signal.

In this particular example, storage elements 211 and 212 are implemented as flip-flops. However, it is noted that this implementation is not intended to be limiting, and thus storage elements 211 and 212 may be implemented using latches, pulse flops, or any other type of suitable storage element. It is also noted that the configuration of alternating positive- and negative-edge triggered storage elements is shown in this example, this implementation is also not intended to be limiting. Thus, embodiments are possible and contemplated wherein storage elements of a shift register are each positive- or negative-edge triggered.

Returning to FIG. 2A, the data and clock signals are input into shift register 21, with the data signal being shifted from one storage element to the next responsive to the clock signal. In example of operation, data may initially be input into shift register 21 as a logic zero, and may subsequently transition to a logic one. The logic zero may propagate through the chain of storage elements of the shift register, followed by the logic one doing the same subsequent to the transition. For the purposes of this disclosure, data is considered to have arrived in shift register 21 with the transition from a logic zero to a logic one. However, this is not limiting, and data may be considered to have arrived in shift register 21 responsive to a transition from a logic one to a logic zero in other embodiments.

The shifting of logic zeros through the shift register followed by the shifting of logic ones may thus result in the register contents at some point storing one or more logic zeros (a consecutive string of zeros when a plurality is present), followed by one or more logic ones (a consecutive string of ones when a plurality is present). Each logic zero and each logic one storage in a storage element may be considered to be one sample of the data. These samples may be captured by waveform capture register 22. In the embodiment shown, waveform capture register 22 is configured to receive an initialization signal, 'Init'. The initialization signal may be a pulse or a periodically received clock signal. However, it is not required in all embodiments that the initialization signal is of a periodic nature. Accordingly, embodiments are possible and contemplated wherein alignment on demand is performed by asserting the initialization signal when desired.

When the initialization signal is asserted, waveform capture register 22 may load, in parallel, all of the samples currently stored in shift register 21. Although not explicitly shown, waveform capture register 22 may include a number of storage elements, wherein each storage element thereof corresponds and is coupled to one of the storage elements of shift register 21. However, waveform capture register 22 is arranged such that samples may be received in parallel from shift register 21. The samples may then be evaluated by circuitry configured to determine when the change of logical state of the data signal occurred. In this embodiment, such circuitry is implemented by leading one detector 23, which is configured to determine the position of the first logic one in waveform capture register 22, and thus the corresponding storage element in shift register 21 to which the first logic one is stored. As noted above, the contents of the waveform capture register 22 after loading samples from shift register 21 comprises a number of logic zeros followed by a number of logic ones. The point at which the state change occurs is indicated by the last logic zero and the first logic one.

Leading one detector 23 in the embodiment shown is coupled to encoder 25. Upon determining the position of the leading one, leading one detector 23 is configured to report this information to encoder 25. In turn, encoder 25 is configured to generate selection signals that are then provided to the multiplexers of multiplexer tree 26. IN the embodiment shown, a first level of multiplexers in multiplexer 23 each have inputs coupled to terminals of storage elements in shift register 21. Returning momentarily to FIG. 2B, it can be seen in the embodiment thereof that both terminals D and Q of each storage element includes a connection to both waveform capture register 22 and inputs of multiplexers in multiplexer tree 26. Based on the selection signals generated by encoder 25, multiplexer tree 26 will couple one terminal associated with a storage element to the output of the final multiplexer. The output of the final multiplexer is another version of the data signal, D_out. Moreover, D_out may be a delayed version of the originally input data signal D if the latter advanced by one or more storage elements in shift register 21.

As previously noted, some embodiments of CGA 20 include a least latency shifter 24. In particular, in embodiments in situations where multiple instances of CGA 20 are implemented in, e.g., a parallel bus, each may include a least latency shifter. In such cases, it is desirable to reduce the latency of each instance of CGA 20 by the lowest latency of any of them. While CGA 20 may lock the alignment of the data and clock signals to a certain relationship, it does not necessarily do so at the smallest latency through the overall circuit. Thus, when multiple signals need to be aligned with a clock signal, it is thus desirable that they all be locked to an alignment having the lowest latency. When multiple instances of CGA 20 are used to align a number of data signals to a clock signal, the least latency shifters may be polled by a polling unit (which can be implemented using hardware or software) to determine which of them has achieved an alignment lock with the lowest latency of all instances of the circuit. After determining the lowest latency among all the instances of CGA 20, the polling unit may direct the least latency shifter(s) 24 of all of the units to shift the selected position by the amount of the least latency, thus causing the encoder to alter the selection signals generated thereby. For example, if the lowest latency found among a number of instances of CGA 20 is three storage elements, all the CGA(s) 20 may be directed to shift their respectively selected position by three storage elements. The latest leading one, i.e. the one having the least latency is also shifted, and thus has zero added latency. As a result of this shifting, all of the data signals will be aligned with the clock signal at the same phase and cycle, and therefore with each other.

Figure 3:
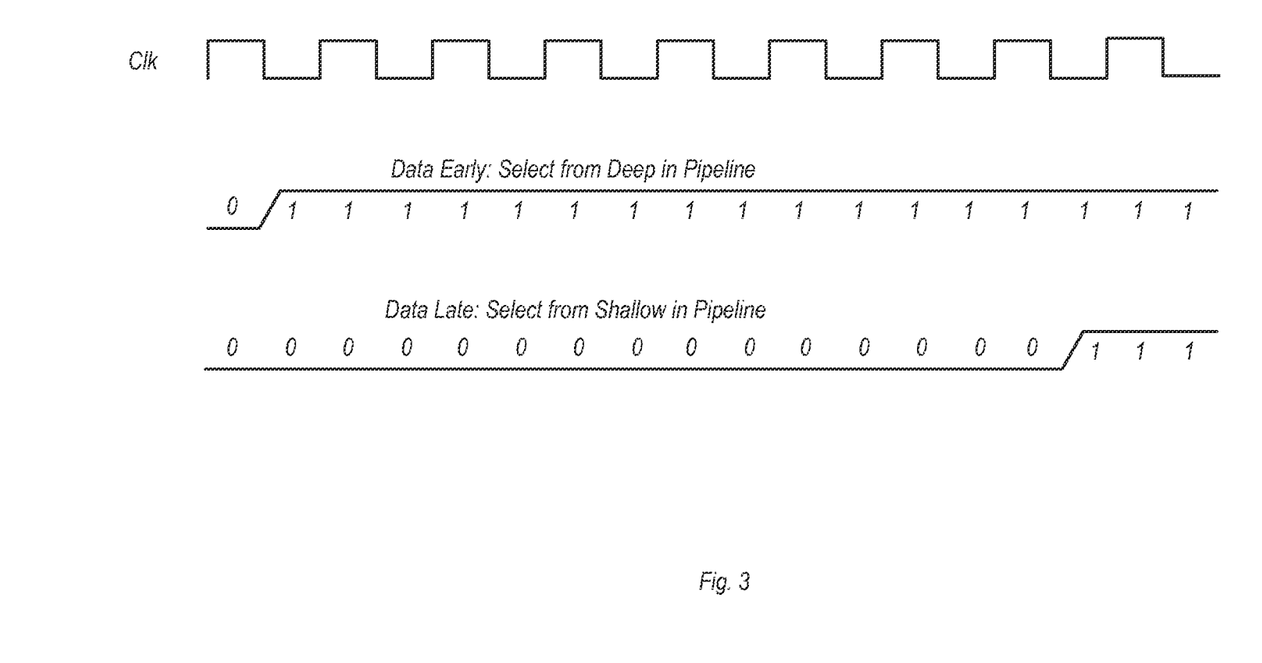
FIG. 3 is a timing diagram illustrating operation of an embodiment of a coarse alignment circuit.

FIG. 3 is a timing diagram that illustrates the operation of one embodiment of CGA 20. In the illustrated example, the clock signal is shown relative to an example of data arriving early and data arriving late. The example case in which data arrives early is indicated by a logic zero followed by a string consecutive of logic ones. In such a case, the output data is selected from deep in the pipeline (e.g., farther to the left side of shift register 21 as shown in FIG. 2B). The example case of data arriving late is indicated by a long string of consecutive logic zeros followed by a short string of consecutive logic ones. In this case, the output data is selected from a shallow point in the pipeline (e.g., farther to the right side of shift register 21 as shown in FIG. 2B).

Figure 4:
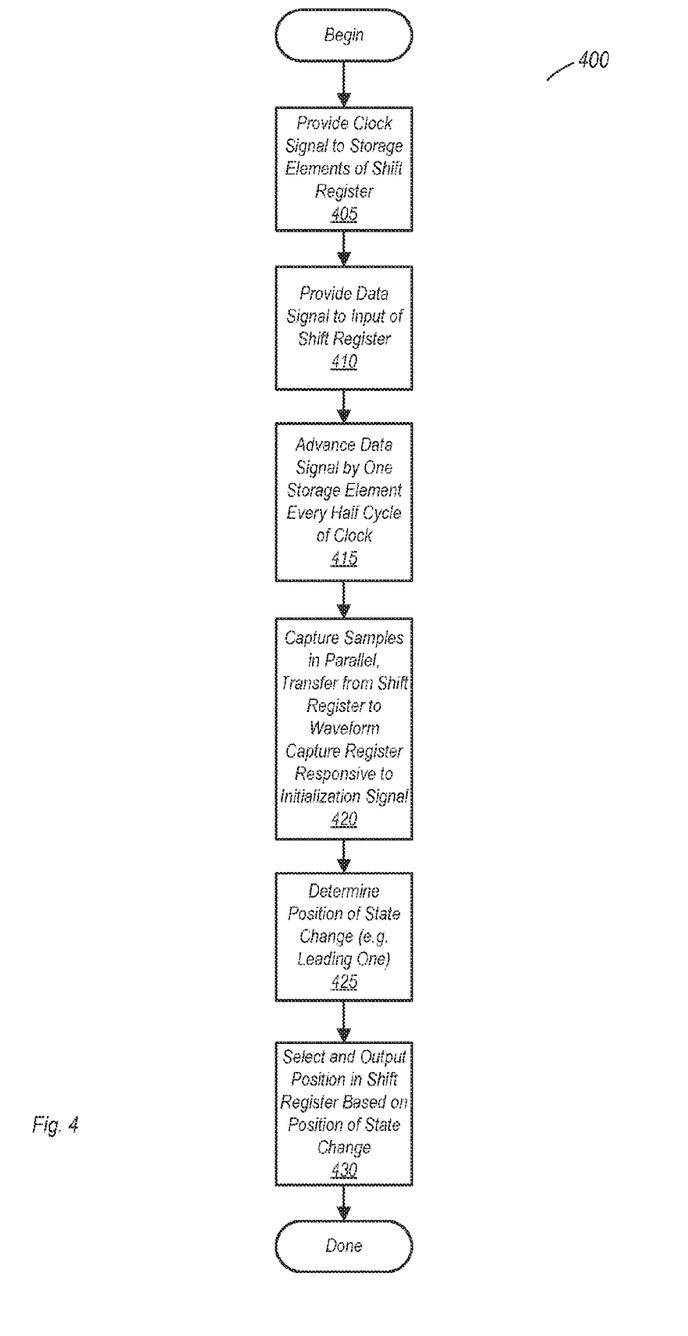
FIG. 4 is a flow diagram illustrating one embodiment of a method for operating a coarse alignment circuit.

FIG. 4 is a flow diagram illustrating one embodiment of a method for operating one embodiment of CGA 20. While the methodology described herein is directed to the embodiment of CGA 20 discussed above, it is noted that method 400 may be performed on other embodiments of a coarse grain alignment circuit.

Method 400 begins with the providing of a clock signal to each storage element of a shift register (block 405) and providing a data signal to data input of the shift register (block 410). Thereafter, the data signal is propagated through the shift register, advancing by one storage element every one half-clock cycle (block 415). It is noted that other embodiments are possible and contemplated in which the data signal is advanced, e.g., by one storage element every one clock cycle. Irrespective of the clock interval used to advance the data signal, each interval used results in a sampling of the data signal waveform in the storage elements of the shift register.

After a certain amount of time has elapsed, an initialization signal is asserted. The asserted initialization signal, when received by a waveform capture register, causes the capture of all samples currently in the shift register (block 420). The samples are written in parallel from the shift register to the waveform capture register. After the samples of the data signal have been written into the waveform capture register, a leading one detector may detect the position of the leading one within the samples (block 425). In other embodiments, other types of detection circuitry may be used, and generally, may detect a position in the waveform capture register indicative of a state change, and thus the time at which the data signal changed states (e.g., from a logic zero to a logic one). Based on the position detected position of the leading one (or indication of change of state), the corresponding position in the shift register is selected to be output (e.g., via a multiplexer tree) as another version of the data signal. The output version of the data signal may be a delayed version and may be aligned with the clock signal.

Figure 5:
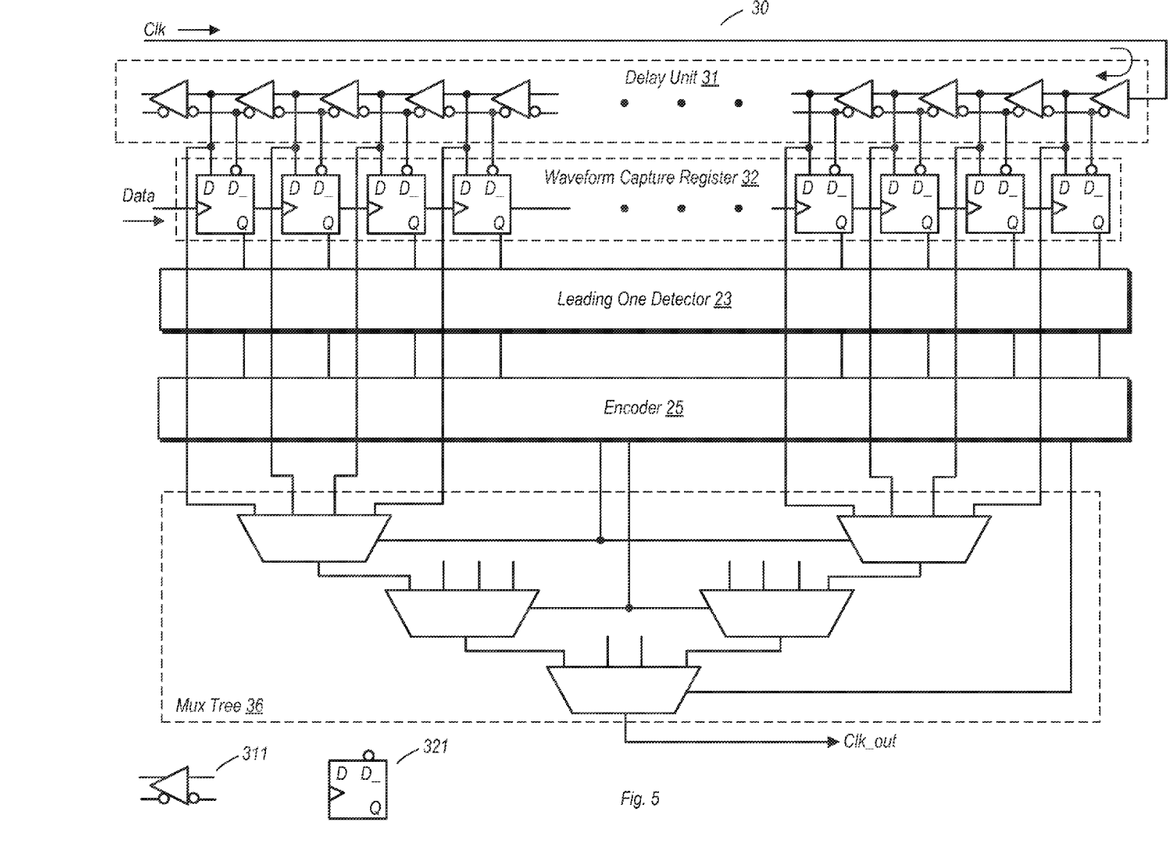
FIG. 5 is a diagram illustrating one embodiment of a fine alignment circuit.

FIG. 5 is a diagram illustrating one embodiment of FGA 30. In the embodiment shown, FGA 30 includes a delay unit 31, a waveform capture register 32, a leading one detector 23, an encoder 25, and a multiplexer tree 36. FGA 30 is similar to CGA 20 in that its operation is entirely digital and does not use circuitry intended to perform analog operations of interest. Furthermore, FGA 30 does not include a feedback loop, and is configured to evaluate a number of samples of a signal in a simultaneous or concurrent manner.

Figure 6:
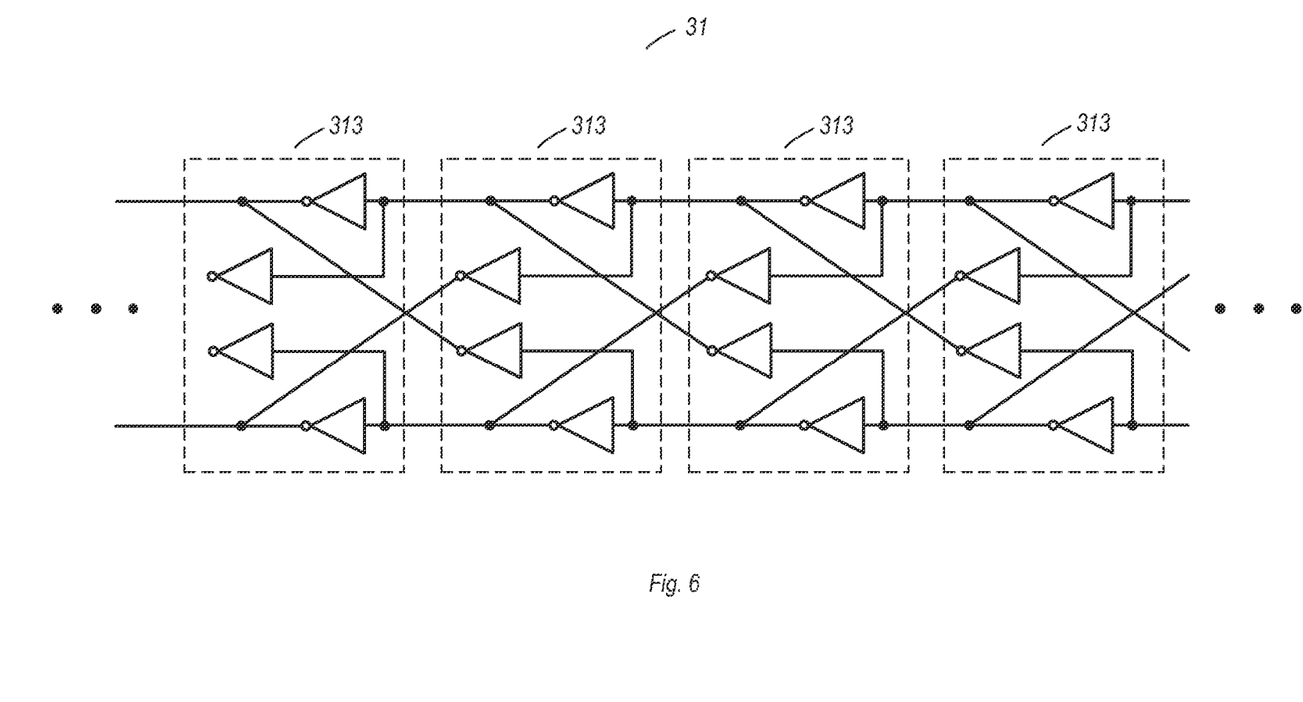
FIG. 6 is a diagram illustrating one embodiment of a delay unit implemented in a fine alignment circuit.

FGA 30 is configured to align an edge of the clock signal with a change of state of the data signal. In this particular embodiment FGA 30 is configured to align the rising edge of the clock signal, Clk, with the rising edge of the data signal. The clock signal is input is into a first delay element 311 of delay unit 31. Delay unit 31 in this embodiment is comprised of a number of serially-coupled delay elements 311. An alternate embodiment of delay unit 31 is shown in FIG. 6, which comprises a number of serially coupled delay elements 313. Delay unit 31 in FIG. 6 is a dual-rail delay chain in which each delay element 313 includes two cross-coupled inverters that transfer signals between the two rails. The cross-coupled inverters are arranged in a feed-forward configuration in this embodiment. The sizing of the transistors used in the inverters may be varied in some cases to enhance the overall resolution of delay unit 31, which can in turn improve the overall performance of FGA 30.

Both embodiments of delay unit 31 discussed above are configured to convey a differential logic signal comprising true and complementary data. A first delay element of delay unit 31, i.e. the delay element coupled to receive the clock signal from an external source, may receive true data and may output both true and complementary data. Embodiments of a delay unit 31 configured to convey single-ended data are also possible and contemplated. Furthermore, embodiments wherein the first delay element of a delay unit 31 receives the input signal in true and complementary form are also possible and contemplated.

The clock signal upon being received by delay unit 31 may propagate through the delay elements 311 of delay unit 31. In the embodiment shown, the range of delay unit 31 is such that one and only one transition of the clock signal is present therein at any given time.

Waveform capture register 32 includes a number of storage elements 321. Each storage element 321 in the embodiment shown includes a true data input D and a complementary data input, D_. The true input D of each storage element 321 is coupled to a true output of a corresponding delay element 311. Similarly, each complementary input D_of each storage element 321 is coupled to a complementary output of a corresponding delay element 311. The clock input of each storage element 321 is coupled to receive the data signal. In this embodiment, when the data signal rises (transitions from a logic zero to a logic one), each of the storage elements 321 is edge-triggered and becomes transparent. Accordingly, samples (i.e. logic states) on the outputs of each of the correspondingly coupled delay elements 311 are captured into and stored in the storage elements 321 of waveform capture register 32. The arrangement of the coupling of delay unit 31 to waveform capture register 32 is such that all samples are captured in parallel.

The data signal input into the clock inputs of storage elements 321 may be timed such that the rising edge of the data enables the captures the rising edge of the clock signal in this particular embodiment of FGA 30. The position of the rising edge of the clock signal may be determined by leading one detector 23, which functions similarly to its counterpart implemented in CGA 20. That is, leading one detector 23 is configured to concurrently evaluate all samples captured to detect the position of the first logic one in waveform capture register 23, and thus the equivalent position of the first logic one in delay line 31 at the time the samples were captured. This in turn determines the amount of delay that is applied to produce the output signal, Clk_out. It is noted that, similar to the CGA 20 above, other types of detection circuitry in lieu of leading one detector 23 may be implemented in alternate embodiments of FGA 30. Similarly, the state change detected by such detection circuitry can be logic one to zero transition rather than a logic zero to one transition as discussed herein.

Leading one detector 23 in the embodiment shown is coupled to provide a code indicative of the position of the leading one to encoder 25. Responsive to this code, encoder 25 is configured to generate selection signals to be input to the selection inputs of the various multiplexers in multiplexer tree 36. The inputs of each of a first level of multiplexers in multiplexer tree 36 are coupled to true outputs of corresponding ones of delay elements 311. Each correspondingly coupled delay element 311 may provide its true output to one inputs of a multiplexer in multiplexer tree 36. The selection signals generated by encoder 25 may thus be used to create a signal path between the output of one of delay elements 311 of delay unit 31 and the output of a final multiplexer in the multiplexer tree 36 (which is the output of FGA 30). The final output signal, Clk_out, may be a delayed version of the input clock signal, Clk. Furthermore, furthermore, the edges of the output clock signal Clk_out and the input data signal may be substantially aligned such that any error between the two is negligible considering the overall operating speed of the system. For example, one embodiment of FGA 30 may output the delayed version of the clock signal, Clk_out, having a rising edge that is within 2 ps (picoseconds) of an edge of the data signal within an overall window of 90 ps. Thus, the 2 ps error is well within the window and is negligible.

FGA 30 may lock to a particular signal alignment in a very short time. The circuit may generate all possible delays in the delay elements 311 of delay line 31 and convert these delays into digital form. A combinational logic decision is then performed based on concurrent inspection of all the delays in digital form (e.g., by leading one detector 23). The wait time between the beginning of operation and achieving alignment lock between the clock and data signals includes delay time in the delay line, the resolving of any metastability in the storage elements 321 of waveform capture register 32, and the subsequent combinational logic operations of leading one detector 23, encoder 25, and multiplexer tree 36. In one embodiment, alignment lock may be achieved within approximately one ns (nanosecond), whereas circuits including analog circuitry (e.g., PLLs, DLLs) may require a microsecond or more.

Figure 7:
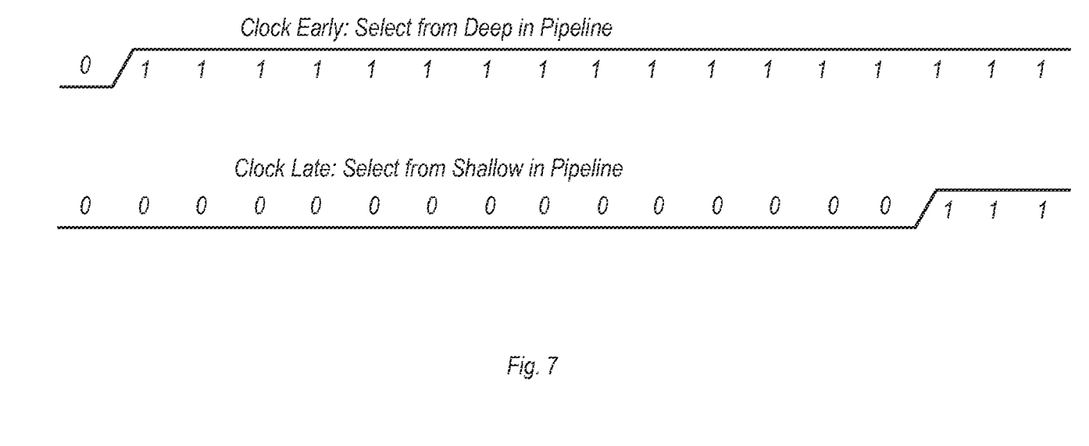
FIG. 7 is a timing diagram illustrating the operation of one embodiment of a fine alignment circuit.

FIG. 7 is a timing diagram that further illustrates the operation of FGA 30. In a first example, the clock signal arrives early relative to the data. In this particular example, the clock is low for one cycle (indicated by sampling logic zero) and then high for a number of cycles (indicated by a group of consecutive samples that are logic ones). Accordingly, the position selected by multiplexer tree 36 is deep in the pipeline of delay elements comprising delay unit 31.

In the second example of FIG. 7, the clock has arrived late. A first group of samples results in a number of consecutive logic zeros. A second (significantly smaller) group of samples results in a number of consecutive logic ones. Thus, the position selected by multiplexer tree is shallow in the pipeline of delay elements comprising delay element 31.

Figure 8:
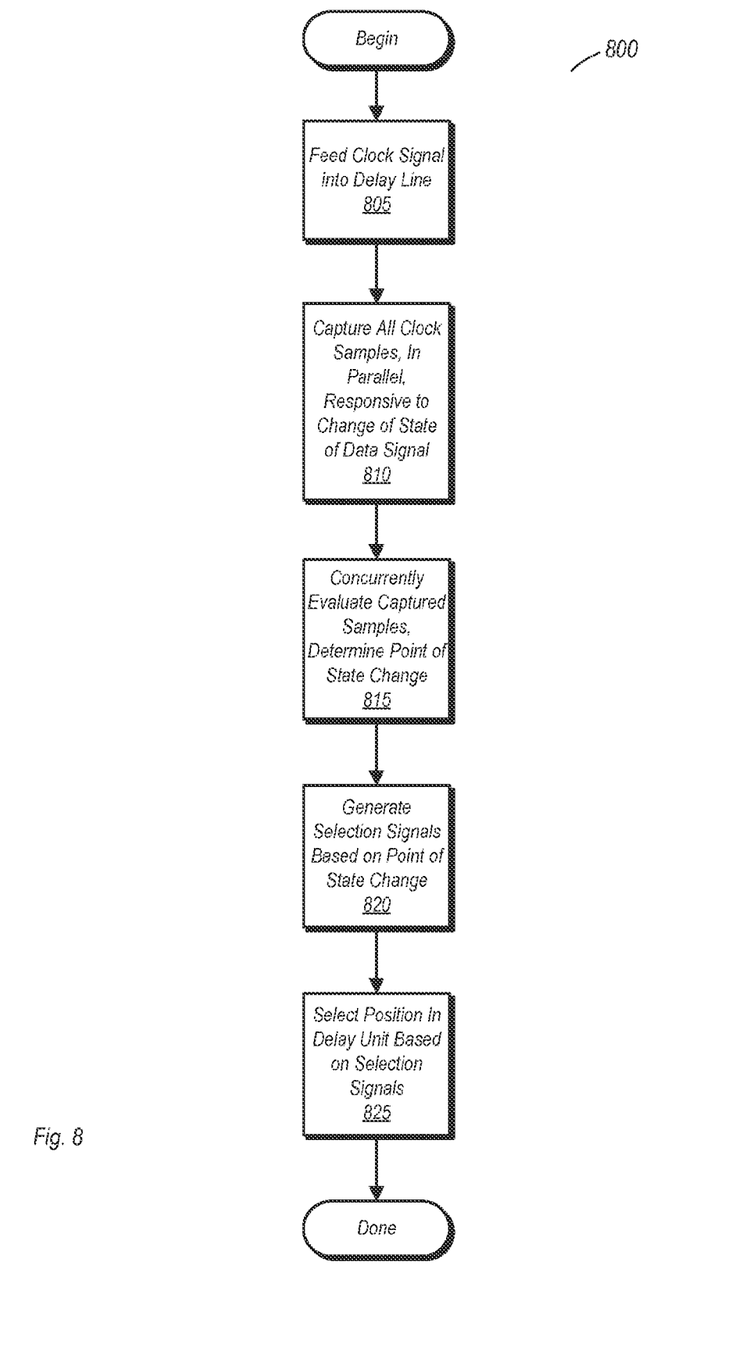
FIG. 8 is a flow diagram illustrating one embodiment of method for operating a fine alignment circuit.

FIG. 8 is a flow diagram illustrating a method for operating one embodiment of FGA 30. While the methodology described herein is directed to the embodiment of FGA 30 discussed above, it is noted that method 800 may be performed on other embodiments of a fine grain alignment circuit.

Method 800 begins with the feeding of a signal (e.g., a clock signal) into a delay line (block 805). The delay line may comprise a number of serially-coupled delay elements, and the signal may propagate serially through these elements. The samples of the signal in the delay line may then be captured, in parallel, into a register responsive to a change of state of a data signal or other signal (block 810). In one embodiment, the rising edge of a data signal may trigger the capturing of the samples. The samples may then be simultaneously/concurrently evaluated to determine the point of a state change of the signal that was input into the delay line (block 815). The state of change may be a rising edge of a clock signal, as discussed above, and may be detected by the presence of the first logic one in the register following a number of logic zeros. Based on the detected position of the state change of the signal input into the delay line, selection signals may be generated (block 820). These selection signals may create a signal path, in a multiplexer tree, between an output of the selected delay element in the delay unit and the output of the multiplexer tree (block 825). The signal output from the multiplexer tree may be a delayed version of the signal originally input into the delay line.

Numerous variations and modifications will become apparent to those skilled in the art once the above disclosure is fully appreciated. It is intended that the following claims be interpreted to embrace all such variations and modifications.

What is claimed is:

1. A circuit comprising:
   a register configured to capture and store, in parallel from a delay unit, a plurality of samples of a first signal, responsive to a change of state of a second signal;
   a detection circuit configured to detect a bit position in the register at which a state change of the first signal occurs based on a concurrent evaluation of all samples of the first signal; and
   selection circuitry configured to select an output from a one of a plurality of delay elements of the delay unit based on the bit position at which the state change was detected, wherein the selection circuitry is configured to output a third signal that is a delayed version of the first signal.

2. The circuit as recited in claim 1, wherein the delay unit comprises a plurality of serially-coupled delay elements, wherein a first one of the delay elements is coupled to receive the first signal.

3. The circuit as recited in claim 2, wherein the delay unit comprises a first rail configured to receive the first signal and a second rail configured to receive a complement of the first signal, and wherein each delay element includes a pair of cross-coupled inverters.

4. The circuit as recited in claim 2, wherein the register comprises a plurality of serially-coupled storage elements, wherein a clock input of each of the serially-coupled storage elements is configured to receive the second signal, and wherein at least one data input of each of the serially-coupled storage elements is coupled to a terminal of a corresponding one of the delay elements.

5. The circuit as recited in claim 1, further comprising an encoder coupled to the detection circuitry, wherein the encoder is configured to generate selection signals based on the bit position in the register at which a state change of the first signal was detected by the detection circuit.

6. The circuit as recited in claim 5, wherein the selection circuitry comprises a multiplexer tree having a plurality of multiplexers, wherein each of the multiplexers includes one or more selection inputs coupled to receive corresponding selection signals from the encoder.

7. The circuit as recited in claim 6, wherein each of the plurality of multiplexers includes a corresponding plurality of data inputs, and wherein each data input of each of a subset of the plurality of multiplexers is coupled to a corresponding unique one of the terminals of one of a plurality of delay elements of the delay unit.

8. The circuit as recited in claim 1, wherein the detection circuit is a leading one detector configured to detect a position of a leading logic one in the plurality of samples stored in the register, wherein the plurality of samples stored in the register comprises a one or more consecutive logic zeros followed by one or more consecutive logic ones, wherein the one or more consecutive logic zeros are older data than the one or more consecutive logic ones.

9. A method comprising:
   capturing and storing, in parallel, a plurality of samples of a first signal responsive to a change of state of a second signal, wherein said capturing comprises a register capturing the plurality of samples from a delay unit having a plurality of serially-coupled delay elements;
   detecting a bit position in the register at which a state change of the first signal is detected based on a concurrent evaluation of all the samples of the first signal; and
   selecting, based on the bit position at which the state of change of the first signal was detected, an output of one of the delay elements to be coupled via selection circuitry to provide a third signal, wherein the third signal is a delayed version of the first signal.

10. The method as recited in claim 9, further comprising inputting the first signal into a first one of a plurality of serially-coupled delay elements of the delay unit.

11. The method as recited in claim 10, further comprising inputting the first signal into a first rail of the delay unit and inputting a complement of the first signal into a second rail of the delay unit, wherein each delay element comprises a pair of cross-coupled inverters.

12. The method as recited in claim 10, further comprising inputting the plurality of samples of the delay unit into the register by writing from an output of each delay element to a data input of a correspondingly coupled storage element.

13. The method as recited in claim 9, further comprising an encoder generating selection signals to perform said selecting based on the bit position in the register at which a state change of the first signal was detected.

14. The method as recited in claim 13, further comprising providing the selection signals to selection inputs of a plurality of multiplexers forming a multiplexer tree, wherein the multiplexer tree is configured to select as an input a terminal of one of the plurality of delay elements based on the received selection signals.

15. The method as recited in claim 9, further comprising performing said detection using a leading one detector, wherein said detecting comprises the leading one detector detecting a position of a leading logic one in the plurality of samples stored in the register, wherein the plurality of samples stored in the register comprises a one or more consecutive logic zeros followed by one or more consecutive logic ones, wherein the one or more consecutive logic zeros are older data than the one or more consecutive logic ones.

16. A circuit comprising:
   a delay line comprising a plurality of serially-coupled delay elements, wherein a first one of the delay elements is coupled to receive a first signal;
   a capture register configured to capture and store a plurality of samples of the first signal responsive to a state change of a second signal;
   a detector configured to detect, a position of a logical transition of the first signal based on the plurality of samples stored in the capture register;
   an encoder configured to generate selection signals based on the position of the logical transition; and
   a multiplexer tree configured to select an output of one of the delay elements based on the selection signals, wherein an output of the multiplexer tree is a third signal that is a delayed version of the second signal.

17. The circuit as recited in claim 16, wherein the capture register includes a plurality of serially-coupled storage elements, wherein at least one data input of each of the storage elements is coupled to an output of a corresponding one of the delay elements, and wherein each of the storage elements includes a clock input configured to receive a second signal.

18. The circuit as recited in claim 16, wherein the delay unit comprises a first rail configured to receive the first signal and a second rail configured to receive a complement of the first signal, and wherein each delay element includes a pair of cross-coupled inverters.

19. The circuit as recited in claim 16, wherein the capture register comprises a plurality of serially-coupled storage elements, wherein a clock input of each of the serially-coupled storage elements is configured to receive the second signal, and wherein at least one data input of each of the serially-coupled storage elements is coupled to terminal of a corresponding one of the delay elements.

20. The circuit as recited in claim 16, wherein the detector is a leading one detector configured to detect a position of a leading logic one in the plurality of samples stored in the register, wherein the plurality of samples stored in the register comprises a one or more consecutive logic zeros followed by one or more consecutive logic ones, wherein the one or more consecutive logic zeros are older data than the one or more consecutive logic ones.

\* \* \* \* \*